(12) United States Patent
Yamadaya et al.

(10) Patent No.: US 10,611,934 B2
(45) Date of Patent: Apr. 7, 2020

(54) PERMANENT ADHESIVE COMPOSITION FOR IMAGE SENSORS, AND BONDING METHOD AND LAMINATE USING SAME

(71) Applicants: TOKYO OHKA KOGYO CO., LTD., Kawasaki-shi (JP); NIPPON STEEL CHEMICAL & MATERIAL CO., LTD., Tokyo (JP)

(72) Inventors: Tokunori Yamadaya, Kawasaki (JP); Hiroaki Takeuchi, Kawasaki (JP); Masatoshi Maeda, Kawasaki (JP); Kentaro Hayashi, Fukuoka (JP); Masayoshi Isozaki, Fukuoka (JP)

(73) Assignees: TOKYO OHKA KOGYO CO., LTD., Kawasaki-Shi (JP); NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 39 days.

(21) Appl. No.: 16/063,663

(22) PCT Filed: Dec. 21, 2016

(86) PCT No.: PCT/JP2016/088198
§ 371 (c)(1),
(2) Date: Jun. 18, 2018

(87) PCT Pub. No.: WO2017/110916
PCT Pub. Date: Jun. 29, 2017

(65) Prior Publication Data
US 2019/0002744 A1 Jan. 3, 2019

(30) Foreign Application Priority Data
Dec. 25, 2015 (JP) ................................. 2015-253512

(51) Int. Cl.
| | | |
|---|---|---|
| *B32B 7/12* | (2006.01) | |
| *C09J 133/10* | (2006.01) | |
| *C09J 133/08* | (2006.01) | |
| *C09J 5/00* | (2006.01) | |
| *C09J 133/04* | (2006.01) | |
| *C09J 11/06* | (2006.01) | |
| *C09J 151/00* | (2006.01) | |
| *C09J 133/14* | (2006.01) | |
| *C09J 125/10* | (2006.01) | |
| *C08K 5/13* | (2006.01) | |
| *C08F 220/18* | (2006.01) | |
| *C08F 265/06* | (2006.01) | |
| *B32B 17/06* | (2006.01) | |
| *B32B 27/30* | (2006.01) | |
| *H01L 27/14* | (2006.01) | |
| *C08K 5/00* | (2006.01) | |

(52) U.S. Cl.
CPC ............... *C09J 133/10* (2013.01); *B32B 7/12* (2013.01); *B32B 17/064* (2013.01); *B32B 27/308* (2013.01); *C08F 220/18* (2013.01); *C08F 265/06* (2013.01); *C09J 11/06* (2013.01); *C09J 125/10* (2013.01); *C09J 133/08* (2013.01); *C09J 133/14* (2013.01); *C09J 151/00* (2013.01); *B32B 2405/00* (2013.01); *C08K 5/005* (2013.01); *C08K 5/13* (2013.01); *H01L 27/14* (2013.01)

(58) Field of Classification Search
None
See application file for complete search history.

(56) References Cited

U.S. PATENT DOCUMENTS

| | | | |
|---|---|---|---|
| 9,115,297 B2 | 8/2015 | Imai et al. | |
| 2008/0021128 A1* | 1/2008 | Haubrich | C08G 18/673 522/113 |
| 2012/0083561 A1* | 4/2012 | Imai | C09J 123/0823 524/323 |
| 2016/0082688 A1* | 3/2016 | Nakai | B29C 39/148 428/141 |

FOREIGN PATENT DOCUMENTS

| | | |
|---|---|---|
| CN | 105102493 A | 11/2015 |
| JP | 2003-277712 | 10/2003 |
| JP | 2009-176941 | 8/2009 |
| JP | 2010-261026 | 11/2010 |
| JP | 2012-092283 | 5/2012 |
| JP | 2014-105316 | 6/2014 |
| JP | 2015-140408 | 8/2015 |
| JP | 2016-044268 | 4/2016 |

OTHER PUBLICATIONS

Office Action issued in Chinese Patent Application No. 201680074490.7, dated Aug. 30, 2019.

* cited by examiner

*Primary Examiner* — Sheeba Ahmed
(74) *Attorney, Agent, or Firm* — Knobbe, Martens, Olson & Bear LLP

(57) ABSTRACT

A permanent adhesive composition for image sensors which provides an adhesive layer having excellent heat resistance and thermal shock resistance, and a bonding method and laminate using the permanent adhesive composition. The permanent adhesive composition for image sensors contains a thermosetting or photocurable resin containing a specific bifunctional (meth)acrylic acid ester-derived structural unit, a polymerizable monomer, and an antioxidant, and used to bond together a substrate and a support for the substrate. The bonding method includes bonding together a substrate and a support for the substrate using the permanent adhesive composition. The laminate is provided with a substrate, a support for the substrate, and an adhesive layer for bonding the substrate and the support together, and the adhesive layer is formed of the permanent adhesive composition.

16 Claims, No Drawings

PERMANENT ADHESIVE COMPOSITION FOR IMAGE SENSORS, AND BONDING METHOD AND LAMINATE USING SAME

This application is the U.S. National Phase under 35 U.S.C. § 371 of International Application PCT/JP2016/088198, filed Dec. 21, 2016, designating the U.S., and published in Japanese as WO 2017/110916 on June 29, 2017 which claims priority to Japanese Patent Application No. 2015-253512, filed Dec. 25, 2015, the entire content of which is incorporated herein by reference.

TECHNICAL FIELD

The present invention relates to a permanent adhesive composition for image sensors, and a bonding method and a laminate using the permanent adhesive composition.

BACKGROUND ART

Patent Document 1 describes an adhesive composition including a hydrocarbon resin and a predetermined solvent, as an adhesive composition having excellent product stability.

Patent Document 1: Japanese Unexamined Patent Application, Publication No. 2012-092283

DISCLOSURE OF THE INVENTION

Problems to be Solved by the Invention

Hydrocarbon resins to be used for general adhesives, for example, a cycloolefin-based material and a styrene-butadiene copolymer are easily colored and do not easily maintain light transmittance, when they undergo a high temperature process. Therefore, it is difficult to use a conventional adhesive composition including hydrocarbon resin as a permanent adhesive in an optical member such as an image sensor.

The present invention is made in view of such conventional circumstances, and an object of the present invention is to provide a permanent adhesive composition for image sensors, giving an adhesion layer having excellent heat resistance and thermal shock resistance, and a bonding method and a laminate using the permanent adhesive composition.

Means for Solving the Problems

The inventors of the present invention have made intensive studies to solve the above-mentioned problems. As a result, the inventors have found that the above-mentioned problems can be solved by combining specific thermosetting or photocurable resin with an antioxidant, and has completed the present invention. Specifically, the present invention provides the followings.

A first aspect of the present invention is a permanent adhesive composition for image sensors, including: (A) a thermosetting or photocurable resin including a structural unit derived from bifunctional (meth)acrylic acid ester, represented by the following general formula (1):

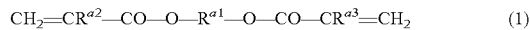
$$CH_2=CR^{a2}-CO-O-R^{a1}-O-CO-CR^{a3}=CH_2 \quad (1)$$

(in the formula, $R^{a1}$ represents a divalent hydrocarbon group having 8 or more and 14 or less carbon atoms, $R^{a2}$ and $R^{a3}$ each independently represent a hydrogen atom or a methyl group), (B) a polymerizable monomer, and (C) an antioxidant, wherein the permanent adhesive composition is used for bonding a substrate and a support body for the substrate to each other.

A second aspect of the present invention is a bonding method including a bonding step of bonding a substrate and a support body for the substrate to each other, using the above-mentioned permanent adhesive composition.

A third aspect of the present invention is a laminate including a substrate, a support body for the substrate, and an adhesion layer that bonds the substrate and the support body to each other, wherein the adhesion layer is formed of the permanent adhesive composition.

Effects of the Invention

The present invention can provide a permanent adhesive composition for image sensors, giving an adhesion layer having excellent heat resistance and thermal shock resistance, and a bonding method and a laminate using the permanent adhesive composition.

PREFERRED MODE FOR CARRYING OUT THE INVENTION

<Permanent Adhesive Composition for Image Sensors>

A permanent adhesive composition for image sensors according to the present invention includes: (A) a thermosetting or photocurable resin including a structural unit derived from bifunctional (meth)acrylic acid ester, represented by the above general formula (1) (hereinafter, also referred to as "thermosetting or photocurable resin (A)"), (B) a polymerizable monomer, and (C) an antioxidant. The permanent adhesive composition is used for bonding a substrate and a support body for the substrate to each other.

A permanent adhesive composition according to the present invention can be used for bonding a substrate (wafer) and a support body to each other. Furthermore, a laminate may be formed by forming an adhesion layer on the substrate or the support body using the permanent adhesive composition, and attaching the substrate and the support body to each other with the adhesion layer interposed therebetween.

The substrate, in a state in which it is supported by a support body, is subjected to processes such as thinning and mounting. The substrate included in the laminate according to the present invention is not limited to a wafer, and any substrates such as a thin film substrate and a flexible substrate can be employed. Furthermore, microstructures of electronic elements such as an electric circuit may be formed on a surface at an adhesion layer side of the substrate. Specific examples of the substrate include a silicon substrate, a sapphire substrate, and the like.

The support body supports the substrate, and is only required to have strength necessary to prevent the substrate from being broken or deformed at the time of processes such as thinning, transporting, and mounting of a substrate. From the viewpoint mentioned above, examples of the support body include those made of glass, silicon, acrylic resin, and the like.

The permanent adhesive composition according to the present invention is applied on the substrate or the support body to form a composition layer, and then the composition layer is heated. Thus, the polymerizable monomer (B) forming the composition layer is polymerized, and flexibility of the layer can be improved. As a result, the permanent adhesive composition according to the present invention gives an adhesion layer whose thermal shock resistance is improved. Furthermore, when the permanent adhesive composition according to the present invention contains a combination of a thermosetting or photocurable resin (A) and an antioxidant (C), yellowing of the adhesion layer by heating is suppressed. Therefore, the permanent adhesive composition according to the present invention gives an adhesion layer whose heat resistance is improved. The permanent adhesive composition according to the present invention can be used as, for example, a permanent adhesive for optical member such as an image sensor. Examples of the image sensor include a CCD sensor, a CMOS sensor, and the like.

[(A) Thermosetting or Photocurable Resin]

A permanent adhesive composition in accordance with the present invention contains (A) a thermosetting or photocurable resin including a structural unit derived from bifunctional (meth)acrylic acid ester, represented by the following general formula (1):

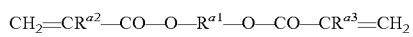

(in the formula, $R^{a1}$ represents a divalent hydrocarbon group having 8 or more and 14 or less carbon atoms, $R^{a2}$ and $R^{a3}$ each independently represent a hydrogen atom or a methyl group).

Since the thermosetting or photocurable resin (A) is excellent in transmittance, heat resistance, and the like, the permanent adhesive composition according to the present invention can be used as a permanent adhesive for an optical member such as an image sensor. The thermosetting or photocurable resin (A) can be used singly or in combination of two or more thereof.

In the above general formula (1), $R^{a1}$ represents a divalent hydrocarbon group having 8 or more and 14 or less carbon atoms and preferably 9 or more and 12 or less carbon atoms. Examples of $R^{a1}$ include an alkylene group having 8 or more and 14 or less carbon atoms and preferably 9 or more and 12 or less carbon atoms, for example, an octenyl group, a nonenyl group, a decenyl group, a dodecenyl group, and the like; a divalent alicyclic hydrocarbon group having 8 or more and 14 or less carbon atoms and preferably 9 or more and 12 or less carbon atoms, for example, a tricyclodecanediyl group, and the like; and a combination of an alkylene group having 1 or more and 4 or less carbon atoms and preferably 1 or more and 3 or less carbon atoms, for example, a methylene-tricyclodecanediyl-methylene group, and a divalent alicyclic hydrocarbon group having 8 or more and 14 or less carbon atoms and preferably 9 or more and 12 or less carbon atoms (however, the total number of carbon atoms is 8 or more and 14 or less, and preferably 9 or more and 12 or less).

In the thermosetting or photocurable resin (A), an amount of the structural unit derived from bifunctional (meth)acrylic acid ester represented by the above general formula (1) is preferably 10 to 60% by mol, and more preferably 20 to 50% by mol of all structural units, from the viewpoint of transmittance and heat resistance and the like.

The thermosetting or photocurable resin (A) preferably has a branch structure from the viewpoint of reactivity, compatibility, transparency, and optical isotropy, and more preferably has at least two or more unsaturated double bonds at its terminal or side chain. Specific examples include polybranched/polyfunctional polymer that is a copolymer composed of a mono-functional monomer having one unsaturated double bond in a molecule, and a bifunctional monomer having two unsaturated double bonds in a molecule. The number average molecular weight of the polybranched/polyfunctional polymer is preferably 10,000 to 500,000, and more preferably 30,000 to 300,000 from the viewpoint of transmittance, and heat resistance. Note here that in the specification, the number average molecular weight is a number average molecular weight calculated as polystyrene, obtained by measurement of gel permeation chromatography. The above-mentioned polybranched/polyfunctional polymer is produced by, for example, copolymerizing a mono-functional monomer having one unsaturated double bond in a molecule and a bifunctional monomer having two unsaturated double bonds in a molecule in a system where a chain transfer agent exists. The above-mentioned polybranched/polyfunctional polymer can be used singly or in combination of two or more thereof.

As a bifunctional monomer having two unsaturated double bonds in a molecule, the bifunctional (meth)acrylic acid ester represented by the above general formula (1) can be used. Since the bifunctional (meth)acrylic acid ester has each one unsaturated double bond on the both ends, only one unsaturated double bond is involved in elongation of a main chain and the other unsaturated double bond can be involved in the elongation of the side chain. As a result, a copolymer having a branch structure can be obtained. The above-mentioned bifunctional monomer including two unsaturated double bonds in a molecule and the above-mentioned bifunctional (meth)acrylic acid ester can be used singly or in combination of two or more thereof.

Examples of the above-mentioned bifunctional (meth)acrylic acid ester include 1,8-octanediol di(meth)acrylate, cyclohexanedimethanol di(meth)acrylate, 1,9-nonanediol di(meth)acrylate, 1,10-decanediol di(meth)acrylate, tricyclodecane di(meth)acrylate, 1,12-dodecanediol di(meth)acrylate, tricyclodecanedimethylol di(meth)acrylate, and the like.

The monofunctional monomer having one unsaturated double bond in a molecule is not particularly limited, and conventionally known mono-functional monomer can be used. For example, a mono-functional monomer in a polymerizable monomer (B) mentioned below can be used.

[(B) Polymerizable Monomer]

The permanent adhesive composition according to the present invention contains a polymerizable monomer (B). When the permanent adhesive composition according to the present invention is applied to a substrate or a support body, and then heated, the polymerizable monomer (B) is polymerized, and the flexibility of the layer can be improved. As a result, the permanent adhesive composition according to the present invention gives an adhesion layer whose thermal shock resistance is improved. The polymerizable monomer (B) can be used singly or in combination of two or more thereof.

The polymerizable monomer (B) is not particularly limited, and conventionally known mono-functional monomers and polyfunctional monomers can be used. From the viewpoint of the reactivity, a polyfunctional monomer is preferable. From the viewpoint that the formed adhesion layer does not become too hard and deformation such as warping can be suppressed, a bifunctional monomer is preferable.

Examples of the monofunctional monomer include (meth)acryl amide, methylol(meth)acrylamide, methoxymethyl(meth)acrylamide, ethoxymethyl(meth)acrylamide, propoxymethyl(meth)acrylamide, butoxymethoxymethyl(meth)acrylamide, N-methylol(meth)acrylamide, N-hydroxymethyl(meth)acrylamide, (meth)acrylic acid, fumaric acid, maleic acid, maleic anhydride, itaconic acid, itaconic anhydride, citraconic acid, citraconic anhydride, crotonic acid, 2-acrylamide-2-methylpropanesulfonic acid, t-butylacrylamidesulfonic acid, methyl(meth)acrylate, ethyl(meth)acrylate, butyl(meth)acrylate, 2-ethylhexyl(meth)acrylate, cyclohexyl(meth)acrylate, 2-hydroxyethyl(meth)acrylate, 2-hydroxypropyl(meth)acrylate, 2-hydroxybutyl(meth)acrylate, 2-phenoxy-2-hydroxypropyl(meth)acrylate, 2-(meth)acryloyloxy-2-hydroxypropyl phthalate, glycerin mono (meth)acrylate, tetrahydrofurfuryl(meth)acrylate, dimethylamino (meth)acrylate, glycidyl(meth)acrylate, dicyclopentenyl oxyethyl(meth)acrylate, acryloyl morpholin, 2,2,2-trifluoroethyl(meth)acrylate, 2,2,3,3-tetrafluoropropyl (meth)acrylate, half (meth)acrylate of a phthalic acid derivative, and the like. These monofunctional monomers may be used singly or in combination of two or more thereof.

Meanwhile, examples of the multifunctional monomer include alkoxylated bisphenol A di(meth)acrylate, 1,6-hexanediol di(meth)acrylate, ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, polypropylene glycol di(meth)acrylate, etoxylated polypropylene glycol di(meth)acrylate, butylene glycol di(meth)acrylate, neopentyl glycol di(meth)acrylate, tricyclodecane dimethanol di(meth)acrylate, 1,6-hexane glycol di(meth)acrylate, 1,9-nonanediol di(meth)acrylate, 9,9-bis[4-(2-(meth)acryloyloxyethoxy)phenyl]fluorene, trimethylolpropane tri(meth)acrylate, glycerin di(meth)acrylate, pentaerythritol di(meth)acrylate, pentaerythritol tri (meth)acrylate, pentaerythritol tetra(meth)acrylate, dipentaerythritol penta(meth)acrylate, dipentaerythritol hexa (meth)acrylate, 2,2-bis(4-((meth)acryloyloxy diethoxy) phenyl)propane, 2,2-bis(4-((meth)acryloyloxy polyethoxy) phenyl)propane, 2-hydroxy-3-(meth)acryloyloxypropyl (meth)acrylate, ethylene glycol diglycidyl ether di(meth) acrylate, diethylene glycol diglycidyl ether di(meth)acrylate, phthalic acid diglycidyl ester di(meth)acrylate, glycerin tri (meth)acrylate, glycerin polyglycidyl ether poly(meth)acrylate, urethane (meth)acrylate (i.e., tolylene diisocyanate), a reaction product of trimethylhexamethylene diisocyanate, hexamethylene diisocyanate, and 2-hydroxyethyl(meth) acrylate, methylene bis(meth)acrylamide, (meth)acrylamide methylene ether, a multifunctional monomer such as a condensate of a polyvalent alcohol and N-methylol(meth) acrylamide, triacrylformal, and the like. These multifunctional monomers may be used singly or in combination of two or more kinds thereof.

Among them, alkoxylated bisphenol A di(meth)acrylate is preferable. Polyfunctional monomers represented by following general formula, for example, etoxylated bisphenol A di(meth)acrylate, propoxylated bisphenol A di(meth)acrylate, and the like, are more preferable.

From the viewpoint of easy availability, reactivity, and the like, an ethylene group and a propylene group are preferable.

The number of carbon atoms of $R^4$ and $R^5$ is preferably 1 to 3, and more preferably 1 or 2 from the viewpoint of easy availability, reactivity, and the like. Examples of $R^4$ and $R^5$ include a methyl group, an ethyl group, a propyl group, an isopropyl group, an n-butyl group, an isobutyl group, an s-butyl group, a t-butyl group, and the like. From the viewpoint of easy availability, reactivity, and the like, a methyl group and an ethyl group are preferable.

Specific examples of the polyfunctional monomer represented by the above formula include NK esters ABE-300, A-BPE-4, A-BPE-6, A-BPE-10, A-BPE-20, A-BPE-30, BPE-80N, BPE-100N, BPE-200, BPE-500, BPE-900, BPE-1300N, and the like, manufactured by Shin Nakamura Chemical Co., Ltd.

Note here that in the present specification, the term "(meth)acrylamide" means both acrylamide and methacrylamide; "(meth)acrylic acid" means both acrylic acid and methacrylic acid; the term "(meth)acrylate" means both acrylate and methacrylate; and the term "(meth)acryloyl" means both acryloyl and methacryloyl.

The content of the polymerizable monomer (B) is preferably 3 to 45 parts by mass and more preferably 5 to 30 parts by mass relative to 100 parts by mass in total of the content of the thermosetting or photocurable resin (A) and the polymerizable monomer (B). When the content of the polymerizable monomer (B) is in the above-mentioned range, flexibility of an adhesive layer made of the permanent adhesive composition according to the present invention is further improved and the thermal shock resistance is also further improved.

[(C) Antioxidant]

The permanent adhesive composition according to the present invention contains an antioxidant (C). The permanent adhesive composition according to the present invention contains the antioxidant (C) together with the thermosetting or the photocurable resin (A), thus yellowing of the adhesion layer by heating is suppressed. Therefore, the permanent adhesive composition according to the present invention gives an adhesion layer whose heat resistance is improved. The antioxidant (C) can be used singly or in combination of two or more thereof.

The antioxidant (C) is not particularly limited, and conventionally known antioxidants can be used. Examples thereof include a phenol-based antioxidant, a hindered

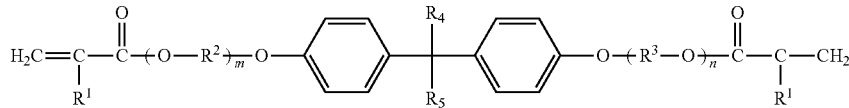

(In the formula, $R^1$ independently represents a hydrogen atom or a methyl group. $R^2$ and $R^3$ each independently represent an alkylene group having 1 to 5 carbon atoms. $R^4$ and $R^5$ each independently represent an alkyl group having 1 to 5 carbon atoms. m and n each independently represent an integer of 1 or more, where m+n is an integer of 2 to 30.)

The number of carbon atoms of $R^2$ and $R^3$ is preferably 2 to 4, and more preferably 2 or 3 from the viewpoint of easy availability, reactivity, and the like. Examples of $R^2$ and $R^3$ include a methylene group, an ethylene group, a propylene group, a trimethylene group, a butylene group, and the like.

amine-based antioxidant, a phosphorus-based antioxidant, a sulfur-based antioxidant, and the like. A phenol-based antioxidant is preferable.

Examples of the phenol-based antioxidant include hindered phenol-based antioxidants such as 4,4-thiobis(6-t-butyl-m-cresol), 3,9-bis[2-{3-(3-t-butyl-4-hydroxy-5-methylphenyl)-propionyloxy}-1,1-dimethyl ethyl]-2,4,8,10-tetraoxaspiro[5.5]undecane, 2,2'-methylene bis(6-t-butyl-4-methyl phenol), 2,2'-methylene bis(6-t-butyl-4-ethyl phenol), 4,4'-butylidene bis(6-t-butyl-3-methyl phenol), 4,4'-thiobis(6-t-butyl-3-methylphenol, alkylated bisphenol, 2,6-di-t-butyl-p-cresol, 2,6-di-t-butyl-4-ethyl phenol, 1,1,3-tris(2-methyl-4-hydroxy-5-t-butyl phenyl)butane, n-octadecyl-3-(3,5-di-t-butyl-4-hydroxy phenyl)propionate, tetrakis〔methylene-3-(3,5-di-t-butyl-4-hydroxy phenyl)propionate〕methane, triethylene glycol bis〔3-(3-t-butyl-4-hydroxy-5-methylphenyl)propionate, and tris(3,5-di-t-butyl-4-hydroxy benzyl)isocyanurate.

Examples of the hindered phenol-based antioxidant include bis(1,2,2,6,6-pentamethyl-4-piperidinyl)sebacate, 2-(3,5-di-t-butyl-4-hydroxy benzyl)-2-n-butylmalonic acid bis(1,2,2,6,6-pentamethyl-4-piperidyl), and the like.

Examples of the phosphorus-based antioxidant include tris(2,4-di-t-butyl phenyl)phosphite, tetrakis(2,4-di-t-butyl phenyl)-4,4'-biphenylene phosphite, tris nonylphenylphosphite, bis(2,4-di-t-butyl phenyl)pentaerythritol diphosphite, distearylpentaerythritol diphosphate, and the like.

Examples of the sulfur-based antioxidant include dilauryl 3,3-thidipropionate, dimyristyl 3,3-thiodipropionate, distearyl 3,3-thiodipropionate, ditridecyl-3,3-thiodipropionate, pentaerythrityl-tetrakis(3-lauryl-thio-dipropionate, 2-mercaptobenzimidazole, and the like.

Among them, as the antioxidant (C), from the viewpoint that it is easy to obtain an adhesion layer whose heat resistance in a high temperature process at 280° C. for 10 minutes is improved, the hindered phenol-based antioxidant is more preferable, and 3,9-bis[2-〔3-(3-t-butyl-4-hydroxy-5-methylphenyl)-propionyloxy〕-1,1-dimethyl ethyl]-2,4,8,10-tetraoxaspiro[5.5]undecane, 2,6-di-t-butyl-p-cresol, tetrakis〔methylene-3-(3,5-di-t-butyl-4-hydroxy phenyl)propionate〕methane, tris(3,5-di-t-butyl-4-hydroxy benzyl)isocyanurate, and 1,1,3-tris(2-methyl-4-hydroxy-5-t-butyl phenyl)butane are particularly preferable. Furthermore, it is easy to obtain an adhesion layer whose heat resistance in a high temperature process at 150° C. for 1000 hours is also improved, when a combination of 3,9-bis[2-〔3-(3-t-butyl-4-hydroxy-5-methylphenyl)-propionyloxy〕-1,1-dimethyl ethyl]-2,4,8,10-tetraoxaspiro[5.5]undecane and the other hindered phenol-based antioxidants, in particular, a combination of 3,9-bis[2-〔3-(3-t-butyl-4-hydroxy-5-methylphenyl)-propionyloxy〕-1,1-dimethyl ethyl]-2,4,8,10-tetraoxaspiro[5.5]undecane and 2,6-di-t-butyl-p-cresol is used.

The content of the antioxidant (C) is preferably 0.1 to 5 parts by mass and more preferably 0.3 to 2.0 parts by mass relative to 100 parts by mass in total of the content of the thermosetting or photocurable resin (A) and the polymerizable monomer (B). When the content of the antioxidant (C) is in the above-mentioned range, the heat resistance of the adhesion layer formed of the permanent adhesive composition according to the present invention is further easily improved.

[Solvent]

The permanent adhesive composition according to the present invention may contain a solvent having a function of dissolving the thermosetting or photocurable resin (A), the polymerizable monomer (B), and the antioxidant (C). The solvent can be used singly or in combination of two or more kinds of solvents.

Examples of the solvent include (poly)alkylene glycol monoalkyl ethers such as ethylene glycol monomethyl ether, ethylene glycol monoethyl ether, ethylene glycol-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate (PGMEA), and propylene glycol monoethyl ether acetate; other ethers such as diethylene glycol dimethyl ether, diethylene glycol methylethyl ether, diethylene glycol diethyl ether, and tetrahydrofuran; ketones such as methyl ethyl ketone, cyclohexanone, 2-heptanone, and 3-heptanone; alkyl lactates such as methyl 2-hydroxypropionate and ethyl 2-hydroxypropionate; other esters such as ethyl 2-hydroxy-2-methylpropionate, methyl 3-methoxypropionate, ethyl 3-methoxy propionate, methyl 3-ethoxypropionate, ethyl 3-ethoxypropionate, ethyl ethoxyacetate, ethyl hydroxyacetate, methyl 2-hydroxy-3-methylbutanoate, 3-methyl-3-methoxybutylacetate, 3-methyl-3-methoxybutylpropionate, ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylene; amides such as N-methylpyrrolidone, N,N-dimethylformamide, and N,N-dimethylacetamide; and the like.

Among the above-mentioned solvents, propylene glycol monomethyl ether, ethylene glycol monomethyl ether acetate, propylene glycol monomethyl ether acetate (PGMEA), propyleneglycol monoethyl ether acetate, diethylene glycol dimethyl ether, diethylene glycol methylethyl ether, cyclohexanone, and 3-methoxybutyl acetate are preferable because they exhibit excellent solubility with respect to the thermosetting or photocurable resin (A), the polymerizable monomer (B), and the antioxidant (C). It is particularly preferable to use propylene glycol monomethyl ether acetate (PGMEA).

A content of the solvent is preferably set such that a solid content concentration of the permanent adhesive composition is 40 to 90% by mass, and more preferably 50 to 80% by mass.

[(D) Polymerization Initiator]

A permanent adhesive composition according to the present invention may contain a polymerization initiator (D) if necessary. The polymerization initiator (D) can be used singly or in combination of two or more of them. Examples of the polymerization initiator (D) include a photopolymerization initiator, a thermopolymerizable initiator, and the like.

As the photopolymerization initiator, for example, compounds such as an acetophenone-based compound, a benzoin-based compound, a benzophenone-based compound, a thioxanthone-based compound, and an acylphosphine oxido-based compound can be preferably used. Specific examples thereof include trichloroacetophenone, diethoxy acetophenone, 1-phenyl-2-hydroxy-2-methylpropane-1-one, 1-hydroxy cyclohexyl phenyl ketone, 2-methyl-1-(4-methyl thiophenyl)-2-morpholino propane-1-one, benzoin methyl ether, benzyl dimethyl ketal, benzophenone, thioxanthone, 2,4,6-trimethyl benzoyl diphenylphosphine oxide, methylphenyl glyoxylate, camphorquinone, benzyl, Anthraquinone, Michler's ketone, and the like. Furthermore, photoinitiating auxiliary agent that exhibit effect in combination with the photopolymerization initiator or a sensitizer can be used together with a photopolymerization initiator. The photopolymerization initiator may be used singly or in a mixture of two or more thereof.

Examples of the thermopolymerizable initiator include various organic peroxides such as a ketone peroxide-based compound, a peroxyketal-based compound, a hydroperoxide-based compound, a dialkyl peroxide-based compound, a diacyl peroxide-based compound, a peroxy dicarbonate based compound, and a peroxy ester based compound, and the like. Specific examples thereof include cyclohexanon peroxide, 1,1-bis(t-hexaperoxy)cyclohexanone, cumene hydroperoxide, dicumyl peroxide benzoyl peroxide, diisopropyl peroxide, t-butyl peroxy-2-ethyl hexanoate, and the like, but not necessarily limited thereto. The thermopolymerizable initiator may be used singly or used in mixture of two or more thereof.

The content of the polymerization initiator (D) is preferably 0.1 to 10 parts by mass and more preferably 0.3 to 1 parts by mass with respect to 100 parts by mass of the thermosetting or photocurable resin (A) and the polymerizable monomer (B).

[Other Components]

The permanent adhesive composition according to the present invention may further include other substance(s) miscible therein, in a range which does not impair essential characteristics of the present invention. For example, the adhesive composition can further contain any of generally-used various additives such as an additional resin, a plasticizer, an adhesive auxiliary substance, a stabilizer, a colorant, and a surfactant, each of which is used to improve performance of the adhesive.

<Bonding Method>

A bonding method in accordance with the present invention includes a bonding step of bonding a substrate and a support body for the substrate to each other, using a permanent adhesive composition according to the present invention. In the above-mentioned bonding step, the substrate and the support body may be bonded to each other by pressurization, or the substrate and the support body may be bonded to each other by heating and pressurization. Temperature, time, and pressure when the substrate and the support body are bonded to each other can be appropriately selected depending on adhesive compositions and the like. For example, the temperature is preferably 50° C. to 250° C., and more preferably 50° C. to 150° C. The time is preferably 10 seconds to 15 minutes, and more preferably 30 seconds to 10 minutes. The pressure is preferably 10 kg to 1,000 kg, and more preferably 50 kg to 500 kg. Furthermore, the substrate and the support body may be bonded to each other under reduced pressure environment (for example, 1 Pa or less).

EXAMPLES

Hereinafter, the present invention is described in further detail via Examples. However, the present invention is not necessarily limited to these Examples.

[Preparation of Adhesive Composition]

Materials

For preparation of an adhesive composition, the following materials are used.

Resin

SEPTON 4033: manufactured by KURARAY CO., LTD, hydrogenated styrene-isoprene-butadiene block copolymer represented by the following formula

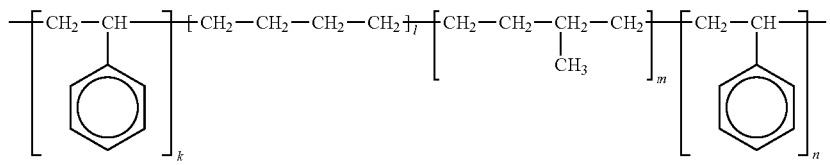

(In the formula, subscripts k to n represent the number of repetition of structural units to which the above-mentioned subscripts are given, respectively.)

APL8008T: manufactured by Mitsui Chemicals, Incorporated, resin represented by the following chemical formula, Mw=100,000, Mw/Mn=2.1, m:n=80:20 (mole ratio)

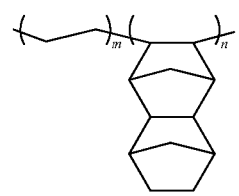

Copolymer A: Copolymer obtained by the following Synthesis Example

Synthesis Example 38 g of 1,9-nonanediol diacrylate, 46 g of dimethylol tricyclodecane diacrylate, 41 g of 2-ethyl hexyl ethylene oxide (n≈2) modified acrylate, 72 g of dicyclopentanyl acrylate, 26 g of 2-hydroxy propyl acrylate, 67 g of 2,4-diphenyl-4-methyl-1-pentene, and 146 g of propylene glycol monomethyl ether acetate were placed into 1 L-reactor, and they were mixed and heated. To the mixture in the reactor, 3 g of benzoyl peroxide was added at 85° C., and reacted at 85° C. for three hours. Polymerization reaction was stopped by cooling, and then, the reaction mixture solution was placed into a large amount of methanol at room temperature to precipitate a polymer. The obtained polymer was washed with methanol, followed by filtration and drying. Thus, 153 g of copolymer A having number-average molecular weight of 180,000 as a polystyrene corresponding value measured by gel permeation chromatography.

Polymerizable Monomer

NK ester BPE-500: manufactured by Shin Nakamura Chemical Co., Ltd., etoxylated bisphenol A dimethacrylate represented by the following chemical formula (wherein m+n is 10)

NK ester BPE-200: manufactured by Shin Nakamura Chemical Co., Ltd., etoxylated bisphenol A dimethacrylate represented by the following chemical formula (wherein m+n is 4)

NK ester BPE-900: manufactured by Shin Nakamura Chemical Co., Ltd., etoxylated bisphenol A dimethacrylate represented by the following chemical formula (wherein m+n is 17)

NK ester BPE-1300N: manufactured by Shin Nakamura Chemical Co., Ltd., etoxylated bisphenol A dimethacrylate represented by the following chemical formula (wherein m+n is 30)

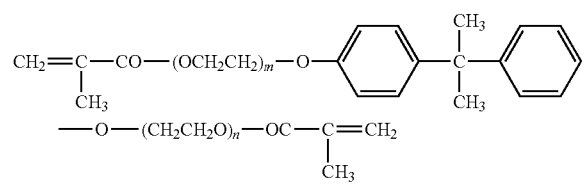

Antioxidant

IRGANOX 1010: manufactured by BASF Japan, antioxidant represented by the following formula, tetrakis[methylene-3-(3,5-di-t-butyl-4-hydroxyphenyl)propionate]methane

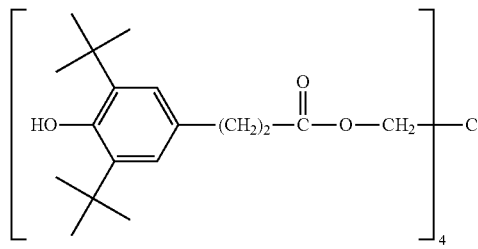

BHT: manufactured by Tokyo Chemical Industry Co., Ltd., an antioxidant represented by the following formula, 2,6-di-t-butyl-p-cresol

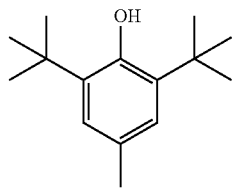 [SMILES: Cc1cc(C(C)(C)C)c(O)c(C(C)(C)C)c1]

ADEKASTAB AO-80: manufactured by ADEKA Corporation, antioxidant represented by the following formula, 3,9-bis[2-[3-(3-t-butyl-4-hydroxy-5-methylphenyl)-propionyloxy]-1,1-dimethylethyl]-2,4,8,10-tetraoxaspiro[5.5]undecane

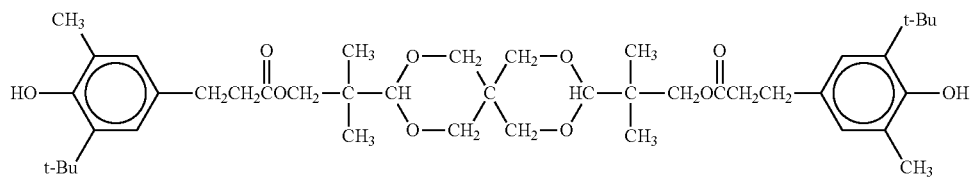

(In the formula, t-Bu represents a t-butyl group.)

A-HD-N: 1,6-hexanediol diacrylate (Shin Nakamura Chemical Co., Ltd.)

FA-512A: dicyclo pentenyl oxyethyl acrylate (manufactured by Hitachi Kasei Co., Ltd.)

ACMO: acryloyl morpholine (manufactured by KJ Chemicals)

ADEKASTAB AO-20: manufactured by ADEKA Corporation, antioxidant represented by the following formula, tris(3,5-di-t-butyl-4-hydroxybenzyl)isocyanurate

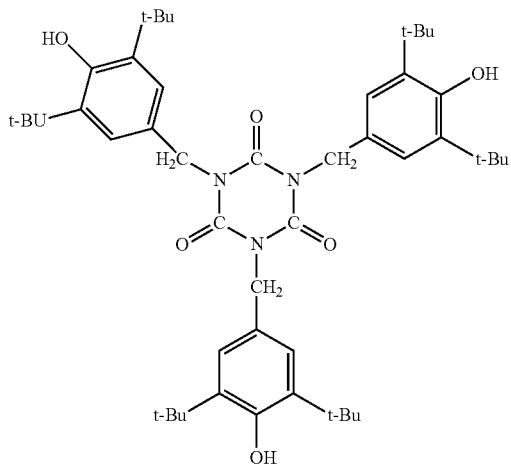

(In the formula, t-Bu is the same as mentioned above.)

ADEKASTAB AO-30: manufactured by ADEKA Corporation, antioxidant represented by the following formula, 1,1,3-tris(2-methyl-4-hydroxy-5-t-butyl phenyl)butane

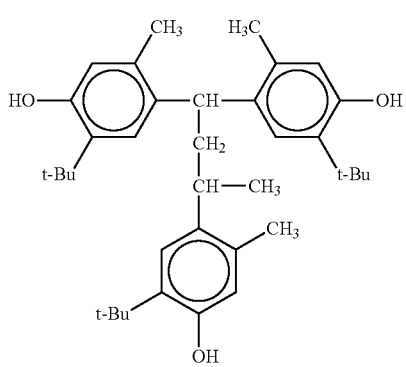

(In the formula, t-Bu is the same as mentioned above.)

Park Mill D: polymerization initiator represented by the following formula (manufactured by NOF CORPORATION)

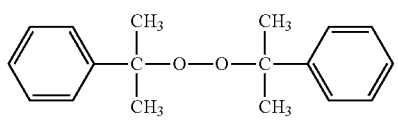

Comparative Examples 1 and 2

Resins shown in Table 1 were dissolved in decahydronaphthalene, and further dissolved in acetic acid butyl. To the obtained solution, antioxidants shown in Table 1 were respectively added to adjust viscosity. Thus, an adhesive composition was prepared. Note here that the amounts of the resin and antioxidant (unit: parts by mass) used were as shown in square bracket in Table 1.

Comparative Example 3 and Examples 1 to 15

To the resins shown in Tables 1 to 3, polymerizable monomers shown in Tables 1 to 3 were added, and the obtained mixture was dissolved in propylene glycol monomethyl ether acetate (PGMEA). To the obtained solution, antioxidants shown in Table 1 to 3 were added to adjust viscosity. Thus, an adhesive composition was prepared. Note here that the amounts of the resin, a polymerizable monomer, and antioxidant (unit: parts by mass) used were as shown in square bracket in Tables 1 to 3. Furthermore, in Example 12, not only a polymerizable monomer but also a polymerization initiator shown in Table 3 was added to the resin. Furthermore, in Comparative Example 3, a polymerizable monomer was not added to the resin and the resin as it is was dissolved in PGMEA.

(Formation of Adhesion Layer)

To 10 cm×10 cm glass substrate, the adhesive composition of Examples or Comparative Examples was applied by spin coating, and baked at temperatures of 130° C. and 150° C. for 5 minutes each to volatilize a solvent to form a composition layer (film thickness: 50 μm). Then, the substrate on which the composition layer was formed was baked in a kiln at 200° C. under nitrogen atmosphere for four hours to thus form an adhesion layer.

(Evaluation of Transmittance)

The transmittance of the formed adhesion layers at a wavelength of 400 nm was measured using a spectrophotometer (instantaneous multichannel photospectroscopic system MCPD3000, manufactured by Otsuka Electronics Co., Ltd.), and the transmittance was evaluated based on the following evaluation criteria. The results are shown in Tables 1 to 3.
○ (good): Transmittance was 98% or more.
x (poor): Transmittance was less than 98%.

(Evaluation of Heat Resistance)

The 10 cm×10 cm glass substrate on which an adhesive layer was formed was put on a hot plate that had been heated to 280° C. and thereby heated for 10 minutes. The transmittance of the heated cured film at 400 nm was measured using a spectrophotometer, and the heat resistance was evaluated based on the following evaluation criteria. The results are shown in Tables 1 to 3.
○ (good): Transmittance was 95% or more.
x (poor): Transmittance was less than 95%.

(Evaluation of Thermal Shock Resistance)

The 10 cm×10 cm glass substrate on which an adhesion layer was formed was put in a cooling thermal-shock test machine TSE-11-A (ESPEC Corp.), and the glass substrate was allowed to move between an incubator at −40° C. and an incubator at 100° C. The holding time of the glass substrate in each incubator was 30 minutes, and heat cycle of total one hour is defined as one cycle. The heat cycle test was carried out up to 100 cycles, and then a state of the adhesion layer was observed by visual observation. Then, thermal shock resistance was evaluated based on the following evaluation criteria. The results are shown in Tables 1 to 3.
○ (good): abnormality was not observed in adhesion layer
x (poor): abnormality such as creases and crack was observed in adhesion layer.

TABLE 1

| | Comparative Example 1 | Comparative Example 2 | Comparative Example 3 | Example | Example 2 | Example 3 |
|---|---|---|---|---|---|---|
| Resin | SEPTON 4033 [100] | APL8008T [100] | Copolymer A [100] | Copolymer A [90] | Copolymer A [90] | Copolymer A [90] |
| Polymerizable monomer | — | — | — | BPE-500 [10] | BPE-500 [10] | BPE-500 [10] |
| Antioxidant | IRGANOX 1010 [1.0] | IRGANOX 1010 [1.0] | IRGANOX 1010 [0.5] | IRGANOX 1010 [0.5] | IRGANOX 1010 [0.5] | AO-80 [0.5] |
| | — | — | — | — | BHT [1.0] | BHT [1.0] |
| Transmittance | ○ | ○ | ○ | ○ | ○ | ○ |
| Heat resistance | x (White turbidity) | ○ | ○ | ○ | ○ | ○ |
| Thermal shock resistance | — | x (Crease) | x (Crack) | ○ | ○ | ○ |

TABLE 2

|  | Example 4 | Example 5 | Example 6 | Example 7 | Example 8 | Example 9 |
|---|---|---|---|---|---|---|
| Resin | Copolymer A [90] | Copolymer A [90] | Copolymer A [90] | Copolymer A [90] | Copolymer A [90] | Copolymer A [90] |
| Polymerizable monomer | BPE-500 [10] | BPE-500 [10] | BPE-200 [10] | BPE-900 [10] | BPE-1300N [10] | BPE-900 [10] |
| Antioxidant | AO-20 [0.5] | AO-30 [0.5] | AO-30 [0.5] | IRGANOX 1010 [0.5] | AO-20 [0.5] | AO-30 [0.5] |
|  | BHT [1.0] | BHT [1.0] | BHT [1.0] | BHT [1.0] | BHT [1.0] | BHT [1.0] |
| Transmittance | ○ | ○ | ○ | ○ | ○ | ○ |
| Heat resistance | ○ | ○ | ○ | ○ | ○ | ○ |
| Thermal shock resistance | ○ | ○ | ○ | ○ | ○ | ○ |

TABLE 3

|  | Example 10 | Example 11 | Example 12 | Example 13 | Example 14 | Example 15 |
|---|---|---|---|---|---|---|
| Resin | Copolymer A [90] | Copolymer A [90] | Copolymer A [90] | Copolymer A [90] | Copolymer A [90] | Copolymer A [90] |
| Polymerizable monomer | BPE-500 [5] A-HD-N [10] | BPE-500 [15] — | BPE-500 [10] — | BPE-500 [10] A-HD-N [10] | BPE-500 [10] FA-512A [10] | BPE-500 [10] ACMO [10] |
| Antioxidant | AO-30 [0.5] BHT [1.0] | AO-30 [0.5] BHT [1.0] | AO-30 [0.5] BHT [1.0] | AO-30 [0.5] BHT [1.0] | AO-30 [0.5] BHT [1.0] | AO-30 [0.5] BHT [1.0] |
| Polymerization initiator | — | — | PERCUMYLD [0.5] | — | — | — |
| Transmittance | ○ | ○ | ○ | ○ | ○ | ○ |
| Heat resistance | ○ | ○ | ○ | ○ | ○ | ○ |
| Thermal shock resistance | ○ | ○ | ○ | ○ | ○ | ○ |

From the results shown in Tables 1 to 3, it is shown that when the thermosetting or photocurable resin (A) and antioxidant (C) are used in combination, an adhesion layer having improved heat resistance can be obtained. Furthermore, it is shown that when the polymerizable monomer (B) is used, an adhesion layer having improved thermal shock resistance can be obtained.

The invention claimed is:

1. A permanent adhesive composition for image sensors, comprising:
  (A) a thermosetting or photocurable resin including a structural unit derived from a bifunctional (meth)acrylic acid ester, represented by the following general formula (1):

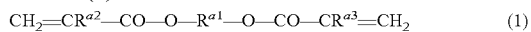

$$CH_2=CR^{a2}-CO-O-R^{a1}-O-CO-CR^{a3}=CH_2 \quad (1)$$

wherein, $R^{a1}$ represents a divalent hydrocarbon group having 8 or more and 14 or less carbon atoms, $R^{a2}$ and $R^{a3}$ each independently represent a hydrogen atom or a methyl group;

(B) a polymerizable monomer; and (C) an antioxidant, wherein (A) has a branch structure, at least two or more unsaturated double bonds at its terminal or side chain, and a number average molecular weight of 10,000 to 500,000, and the permanent adhesive composition is used to bond a substrate and a support body for the substrate to each other.

2. The permanent adhesive composition according to claim 1, wherein the antioxidant (C) includes a phenol-based antioxidant.

3. The permanent adhesive composition according to claim 1, wherein (B) includes a monomer represented by the following formula;

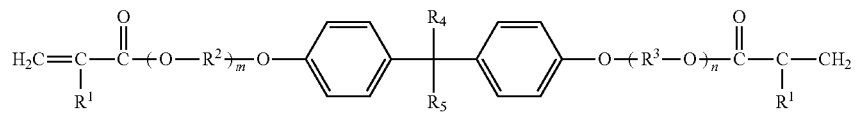

wherein $R^1$ independently represents a hydrogen atom or a methyl group; $R^2$ and $R^3$ each independently represent an alkylene group having 1 to 5 carbon atoms; $R^4$ and $R^5$ each independently represent an alkyl group having 1 to 5 carbon atoms; and m and n independently represent a number of 1 or more, wherein m+n represents a number of 2 to 30.

4. The permanent adhesive composition according to claim 1, wherein the substrate includes a silicon substrate or a sapphire substrate.

5. The permanent adhesive composition according to claim 1, wherein the support body includes a glass substrate.

6. A bonding method comprising bonding a substrate and a support body for the substrate to each other, using the permanent adhesive composition according to claim 1.

7. A laminate comprising a substrate, a support body for the substrate, and an adhesion layer that bonds the substrate and the support body, wherein the adhesion layer is formed from the permanent adhesive composition according to claim 1.

8. The permanent adhesive composition according to claim 1, wherein the permanent adhesive composition does not comprise a polymerization initiator (D).

9. A permanent adhesive composition for image sensors, comprising:
(A) a thermosetting or photocurable resin including a structural unit derived from bifunctional (meth)acrylic acid ester, represented by the following general formula (1):

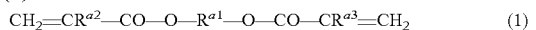

wherein, in the formula, $Ra^{a1}$ represents a divalent hydrocarbon group having 8 or more and 14 or less carbon atoms, $R^{a2}$ and $R^{a3}$ each independently represent a hydrogen atom or a methyl group:

(B) a polymerizable monomer, and (C) an antioxidant, wherein a content of the (B) is 3 to 45 parts by mass relative to 100 parts by mass in total of a content of the (A) and the (B), and the permanent adhesive composition is used for bonding a substrate and a support body for the substrate to each other.

10. The permanent adhesive composition according to claim 9, wherein the (C) includes a phenol-based antioxidant.

11. The permanent adhesive composition according to claim 9, wherein the (B) includes a monomer represented by the following formula;

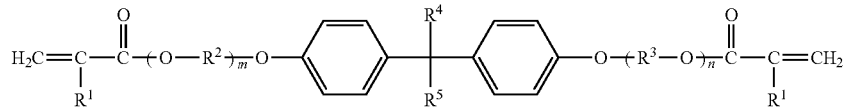

Wherein $R^1$ independently represents a hydrogen atom or a methyl group; $R^2$ and $R^3$ each independently represent an alkylene group having 1 to 5 carbon atoms; $R^4$ and $R^5$ each independently represent an alkyl group having 1 to 5 carbon atoms; and m and n independently represent a number of 1 or more, wherein m+n represents a number of 2 to 30.

12. The permanent adhesive composition according to claim 9, wherein the substrate includes a silicon substrate or a sapphire substrate.

13. The permanent adhesive composition according to claim 9, wherein the support body includes a glass substrate.

14. The permanent adhesive composition according to claim 9, wherein the permanent adhesive composition does not comprise a polymerization initiator (D).

15. A bonding method comprising bonding a substrate and a support body for the substrate to each other, using the permanent adhesive composition described in claim 9.

16. A laminate comprising a substrate, a support body for the substrate, and an adhesion layer that bonds the substrate and the support body, wherein the adhesion layer is formed of the permanent adhesive composition described in claim 9.

* * * * *